(12) United States Patent
Brick et al.

(10) Patent No.: US 8,436,394 B2
(45) Date of Patent: May 7, 2013

(54) LUMINESCENCE DIODE CHIP (75) Inventors: Peter Brick, Regensburg (DE); Matthias Sabathil, Regensburg (DE); Hagen Luckner, Pentling (DE)

(73) Assignee: OSRAM Opto Semiconductors GmbH (DE)

( * ) Notice: Subject to any disclaimer, the term of this patent is extended or adjusted under 35 U.S.C. 154(b) by 94 days.

(21) Appl. No.: 13/124,145

(22) PCT Filed: Oct. 16, 2009

(86) PCT No.: PCT/DE2009/001436
§ 371 (c)(1), (2), (4) Date: Apr. 14, 2011

(87) PCT Pub. No.: WO2010/048921
PCT Pub. Date: May 6, 2010

(65) Prior Publication Data
US 2011/0215369 A1    Sep. 8, 2011

(30) Foreign Application Priority Data
Oct. 31, 2008 (DE) .................. 10 2008 054 218

(51) Int. Cl.
*H01L 33/62* (2010.01)

(52) U.S. Cl.
USPC .................................. 257/99; 257/E33.066

(58) Field of Classification Search ............ 257/99, 257/E33.066
See application file for complete search history.

(56) References Cited

U.S. PATENT DOCUMENTS

| | | | |
|---|---|---|---|
| 3,889,286 A | 6/1975 | Debesis | |
| 4,232,440 A | 11/1980 | Bastek | |
| 6,552,367 B1 | 4/2003 | Hsieh et al. | |
| 2002/0063256 A1 | 5/2002 | Lin | |
| 2003/0062821 A1 | 4/2003 | Wegleiter et al. | |
| 2003/0111667 A1* | 6/2003 | Schubert | 257/98 |
| 2004/0105275 A1 | 6/2004 | Sazuka et al. | |
| 2007/0228368 A1 | 10/2007 | Takahashi et al. | |
| 2008/0111143 A1 | 5/2008 | Ishida et al. | |
| 2008/0212322 A1 | 9/2008 | Schroll | |
| 2008/0246047 A1 | 10/2008 | Hsu et al. | |
| 2009/0180294 A1 | 7/2009 | Baur et al. | |
| 2010/0007269 A1 | 1/2010 | Klein et al. | |

FOREIGN PATENT DOCUMENTS

| | | |
|---|---|---|
| DE | 100 49 573 A1 | 5/2001 |
| DE | 10 2006 015 117 A1 | 10/2007 |
| DE | 10 2006 055 884 A1 | 4/2008 |
| EP | 1 515 368 A2 | 3/2005 |
| JP | 61-263289 A | 11/1986 |
| TW | 200501444 A | 1/2005 |

* cited by examiner

*Primary Examiner* — Calvin Lee
*Assistant Examiner* — Monica D Harrison
(74) *Attorney, Agent, or Firm* — DLA Piper LLP (US)

(57) ABSTRACT

A luminescence diode chip includes a semiconductor layer sequence having an active layer suitable for generating electromagnetic radiation, and a first electrical connection layer, which touches and makes electrically conductive contact with the semiconductor layer sequence. The first electrical connection layer touches and makes contact with the semiconductor layer sequence in particular with a plurality of contact areas. In the case of the luminescence diode chip, an inhomogeneous current density distribution or current distribution is set in a targeted manner in the semiconductor layer sequence by means of an inhomogeneous distribution of an area density of the contact areas along a main plane of extent of the semiconductor layer sequence.

11 Claims, 5 Drawing Sheets

LUMINESCENCE DIODE CHIP

RELATED APPLICATIONS

This is a §371 of International Application No. PCT/DE2009/001436, with an international filing date of Oct. 16, 2009 (WO 2010/048921 A2, published May 6, 2010), which is based on German Patent Application No. 10 2008 054 218.0, filed Oct. 31, 2008, the subject matter of which is incorporated by reference.

TECHNICAL FIELD

This disclosure relates to a luminescence diode chip.

BACKGROUND

A luminescence diode chip may comprise a semiconductor layer sequence having an active layer suitable for generating electromagnetic radiation, and a first electrical connection layer, which touches and makes electrically conductive contact with the semiconductor layer sequence. The first electrical connection layer touches and makes contact with the semiconductor layer sequence in particular with a plurality of contact areas.

High-power luminescence diode chips are known which, compared with other known luminescence diode chips, are operated with a particularly high electrical current density and emit a particularly high radiation power.

Furthermore, headlights having luminescence diode chips as luminous means are known, for example. One example of such headlights is front headlights for motor vehicles.

In the case of high-power luminescence diode chips, it is a fundamental endeavor to ensure that electric current is injected into the semiconductor layer sequence in a manner distributed as uniformly as possible over the entire semiconductor layer sequence during operation of the chips. To make the luminescence diode chips as efficient as possible, they are intended to be operated with a current density that is as high as possible overall. On the other hand, excessively high local electric current densities are intended to be avoided since they could adversely affect the functionality of the semiconductor layer sequence of the luminescence diode chip. With an electric current density distributed homogeneously over the entire active zone of the semiconductor layer sequence, the entire active zone can be optimally utilized and the luminescence diode chip can be made as effective as possible.

It could therefore be helpful to provide a luminescence diode chip with which different headlight applications, in particular a front headlight for motor vehicles, can be realized in a technically simple manner.

SUMMARY

We provide a luminescence diode chip including a semiconductor layer sequence having an active layer that generates electromagnetic radiation, and a first electrical connection layer which touches and makes electrically conductive contact with the semiconductor layer sequence with a plurality of contact area, wherein an inhomogeneous current density distribution is set in the semiconductor layer sequence in a targeted manner by an inhomogeneous distribution of an area density of the contact areas along a main plane of extent of the semiconductor layer sequence such that a first region of a main coupling-out area of the semiconductor layer sequence or of the luminescence diode chip has an irradiance or illuminance at least three times as high as that of at least one second region of the main coupling-out area of the semiconductor layer sequence or of the luminescence diode chip.

DETAILED DESCRIPTION

We provide a luminescence diode chip, the first electrical connection layer of which touches and makes electrically conductive contact with the semiconductor layer sequence with a plurality of contact areas. In the case of the luminescence diode chip, an inhomogeneous current density distribution or current distribution is set in a targeted manner in the semiconductor layer sequence by an inhomogeneous distribution of an area density of the contact areas along a main plane of extent of the semiconductor layer sequence.

Unlike in the case of conventional luminescence diode chips, therefore, there is no optimization to a current distribution or current density distribution that is as homogeneous as possible. Rather, an inhomogeneous current distribution is set in a targeted manner. This affords the possibility, for example, of optimizing an emission characteristic of the luminescence diode chip, for example, the radiance distribution within an emitted radiation cone, even better with regard to specific applications.

The inhomogeneous current density distribution or current distribution may be set, in particular, in such a way that a first region of a main coupling-out area of the semiconductor layer sequence or of the luminescence diode chip has a specific irradiance (unit: W/m2) or specific illuminance (unit: lm/m2) at least three times as high as that of at least one second region of the main coupling-out area of the semiconductor layer sequence or of the luminescence diode chip.

The illuminance of the main coupling-out area can be measured with a detector, for example, which is passed over the main coupling-out area and by which a two-dimensional spatial resolution of the illuminance is thus obtained. Additionally or alternatively, the illuminance can be determined with a luminance camera or radiance camera, the luminance or radiance being measured at different angles and being integrated to form the illuminance or irradiance.

The measurement can be effected in direct proximity to the main coupling-out area. Alternatively, it is also possible to measure an imaging of the chip coupling-out area, even at a relatively large distance from the chip coupling-out area, and thus to determine irradiance or illuminance of the main coupling-out area.

The irradiance or illuminance of the first region of the main coupling-out area may be at least five times, or at least ten times, as great as that of the second region.

The main coupling-out area is the area of a main side facing in the main emission direction of the luminescence diode chip, via which electromagnetic radiation can be coupled out to an adjoining medium. The main coupling-out area is disposed downstream of the active layer in the main emission direction. Partial areas which are covered by a radiation-opaque layer or layer that absorbs radiation to the extent of more than 50% do not belong to the main coupling-out area. One example of such a layer is bonding pads arranged on the main emission side of the semiconductor layer sequence. That region—covered by such a bonding pad—of an area of the semiconductor layer sequence or of the luminescence diode chip which faces in the main emission direction does not belong to the main coupling-out area.

The main coupling-out area of the semiconductor layer sequence is accordingly that area—disposed downstream of the active layer in the main emission direction—of a main side of the semiconductor layer sequence itself which faces in the main emission direction. It can, in particular, be formed by or comprise the outer area of a semiconductor layer. By contrast, the main coupling-out area of the luminescence diode chip can at least partly be formed by a material which is not a constituent part of the semiconductor layer sequence.

A luminescence conversion material may be applied to the main coupling-out area of the semiconductor layer sequence. The luminescence conversion material comprises at least one luminescent material which can be excited by the electromagnetic radiation emitted by the active layer and converts the radiation into an electromagnetic radiation having an altered emission spectrum. If the main coupling-out area of the semiconductor layer sequence is covered with such a luminescence conversion material and the luminescence diode chip comprises no further material disposed downstream of the luminescence conversion material in the main emission direction, then the main coupling-out area of the luminescence diode chip is at least partly formed by that area of the luminescence conversion material which faces in the main emission direction.

In principle, the main coupling-out area of the luminescence diode chip can at least partly be formed by any desired, radiation-transmissive material which is not material of the semiconductor layer sequence.

A "main coupling-out area" should be understood to mean the main coupling-out area of the semiconductor layer sequence, the main coupling-out area of the luminescence diode chip or the main coupling-out area of the semiconductor layer sequence and the luminescence diode chip.

The contact areas are preferably spaced apart from one another. Alternatively, however, it is also possible for the plurality of contact areas or some of the contact areas to be formed integrally with one another. By way of example, a plurality of relatively large contact areas can be connected to one another with relatively thin contact webs, which likewise touch the semiconductor layer sequence. Compared with the relatively large contact areas, however, preferably significantly less electric current is injected into the semiconductor layer sequence via the contact webs. By way of example, less than 10%, preferably less than 5%, particularly preferably less than 2%, of the total current is injected into the semiconductor layer sequence via possible contact webs or contact connections.

The first contact layer may have at least 10, preferably at least 25, particularly preferably at least 50, contact areas. As already mentioned, the contact areas are at least for the most part respectively spaced apart from one another. However, they can also be partly or completely connected to one another. By way of example, a plurality of relatively large-area contact areas can be connected by relatively small-area connecting elements, for example, connecting webs. What is crucial is that a sufficiently inhomogeneous current density distribution is realized by an inhomogeneous distribution of the area density of the contact areas in the semiconductor layer sequence.

The inhomogeneous current distribution may also be an asymmetrical current distribution in the semiconductor layer sequence. The latter is set in a targeted manner by an asymmetrical distribution of the area density of the contact areas along a main plane of extent of the semiconductor layer sequence. With the technical means specified, it is precisely possible also to realize asymmetrical current distributions in the semiconductor layer sequence in a targeted manner in a technically simple way.

The main coupling-out area of the semiconductor layer sequence or of the luminescence diode chip may have an elongated form in plan view. A "plan view" should be understood to mean a view of the main coupling-out area at an angle that runs perpendicularly to a main plane of extent of the main coupling-out area or of the semiconductor layer sequence.

The elongated form has a length, which should be understood to mean an extent of the main coupling-out area along a main direction of extent thereof. The length may be between 2 mm and 10 mm inclusive. The length is preferably greater than or equal to 3 mm, particularly preferably greater than or equal to 4 mm. Through the use of a plurality of contact areas distributed over the semiconductor layer sequence, the luminescence diode chip can be scaled well in terms of its size.

The elongated main coupling-out area has a width, which should be understood to mean an extent measured perpendicularly to the length of the main coupling-out area in a plan view thereof. The width may be greater than or equal to 0.5 mm and less than or equal to 2 mm. The width is preferably at least 1 mm.

The ratio of length to width of the main coupling-out area is greater than or equal to 4:1, preferably greater than or equal to 5:1 or 6:1.

The main coupling-out area may be divided by an imaginary subdivision into two halves. The two halves are separated from one another by a limiting straight line that intersects a length section of the main coupling-out area perpendicularly in the center. The length section corresponds to the above-defined length of the elongated main coupling-out area. This provides the summed area or the number of contact areas in plan view to be greater by at least 15%, preferably by at least 20%, in the region of one of the halves than in the region of the other half.

The luminescence diode chip may also be defined with the aid of an imaginary subdivision of the elongated main coupling-out area into three thirds. This subdivision has limiting straight lines that intersect the length section of the main coupling-out area perpendicularly. A first limiting straight line intersects the length section at one third and a second limiting straight line intersects the length section at two thirds of its total length. This provides for the summed area or the number of contact areas in plan view to be greater by at least 30%, preferably by at least 45%, particularly preferably by at least 65%, in the region of the central third than in each case in the regions of the outer two thirds.

The main coupling-out area may have an asymmetrical form in plan view.

The main coupling-out area of the semiconductor layer sequence or of the luminescence diode chip may have in plan view two sections of an edge which form an angle of between 155° and 175° inclusive at the outer side of the main coupling-out area.

This configuration may provide for the first region of the main coupling-out area to adjoin one of the two sections of the edge or to be at a distance from one of the two sections which amounts to at most 20% of the maximum width of the main coupling-out area.

Relative to the current density and the corresponding radiance, a hot spot of the main coupling-out area is present in the vicinity of at least one of the two sections of the edge. The hot spot either directly adjoins at least one of the two sections. Alternatively, the hot spot is at a distance from at least one of the two sections of the edge which amounts to at most 20% of the maximum width of the main coupling-out area. By way of example, the distance is 30 µm, 50 µm, 100 µm or 200 µm.

In instances in which the main coupling-out area has an elongated form, the width of the main coupling-out area may have an at least local minimum at a location or in a region such that sections having a width that becomes increasingly larger follow the location or the region in both directions along the length of the main coupling-out area. The minimum at the location or in the region can, in particular, also be a global minimum of the width of the main coupling-out area.

The first connection layer may be arranged on a rear side of the semiconductor layer sequence, the rear side being remote from the main coupling-out area. This may provide for a second electrical connection layer to be present, which is likewise arranged on the rear side of the semiconductor layer sequence. The second electrical connection layer laterally overlaps the first electrical connection layer and is electrically insulated from the latter.

The feature that the first or the second electrical connection layer is arranged on the rear side means that at least one part of the connection layer succeeds the semiconductor layer sequence in a direction from the main coupling-out area toward the rear side. However, it is not necessary for the entire first or second electrical connection layer to be arranged at the rear side. Rather, by way of example, a partial region of the first electrical connection layer can extend from the rear side through a perforation of the active layer in a direction toward the front side.

Advantageously, we additionally provide for at least one partial region of the first electrical connection layer to extend from the rear side through a perforation of the active layer in the direction of the main coupling-out area. In particular, it is also possible for a plurality of partial regions of the first electrical connection layer to be present, which, in particular, can in each case extend through a dedicated perforation of the active layer in the direction of the main coupling-out area. The at least one partial region touches the semiconductor layer sequence and forms at least one or all of the contact areas of the first electrical connection layer.

If a partial region of the first electrical connection layer extends from the rear side through a perforation of the active layer in the direction toward the main coupling-out area, then the contact areas of the first connection layer are preferably in each case arranged in a perforation.

Preferably, a plurality of perforations of the active layer are present through which a partial region of the first electrical connection layer extends from the rear side toward the main coupling-out area. Particularly preferably, each of the contact areas of the first electrical connection layer is assigned to a dedicated perforation.

A second electrical connection layer may be present and the first and second electrical connection layers may be arranged on mutually opposite sides of the semiconductor layer sequence. If the second electrical connection layer is arranged on the side of the main coupling-out area, the first electrical connection layer is arranged on the opposite rear side of the semiconductor layer sequence. If the first electrical connection layer is arranged on the side of the main coupling-out area, the second electrical connection layer is arranged on the opposite rear side of the semiconductor layer sequence.

The main coupling-out area of the semiconductor layer sequence may have a structuring suitable for influencing the propagation and coupling-out of the radiation emitted in the active layer. Advantageously, the structuring has a first lateral extent, a second lateral extent, measured perpendicularly to the first lateral extent, and/or a vertical extent, which is greater than or equal to 0.2 times a wavelength of the emission maximum of the electromagnetic radiation and less than or equal to five times a wavelength of the emission maximum of the electromagnetic radiation. Preferably, both the first lateral extent and the second lateral extent and the vertical extent of at least a large portion of the structure units are in each case greater than or equal to 0.2 times a wavelength of the emission maximum of the electromagnetic radiation and less than or equal to five times the wavelength of the emission maximum.

The luminescence diode chip, during its operation, may emit a radiation cone having a radiance distribution corresponding to a radiance distribution for a low-beam light of a motor vehicle. The radiance distribution is, in particular, such that the radiation cone merely has to be projected into a desired solid angle by a projection optical unit, and that the specifications of a low-beam light for a motor vehicle are realized. In this case, the projection optical unit does not have to influence the radiance distribution, or has to influence it only to a small extent such that the specifications are realized.

The luminescence diode chip may be free of a growth substrate such as an epitaxial substrate, for example, on which the semiconductor layer sequence was grown during its production. Such a growth substrate has been at least largely or completely removed from the semiconductor layer sequence.

Additionally or alternatively, the luminescence diode chip has a carrier substrate at its rear side. The carrier substrate is not a growth substrate, rather it is a carrier which is connected to the semiconductor layer sequence after the latter has been formed. The first electrical connection layer and, if appropriate, also the second electrical connection layer can be arranged, in particular, between the semiconductor layer sequence and the carrier substrate.

The different features with regard to the form of the main coupling-out area, in particular considered in plan view, are already advantageous independently of the targeted setting of an inhomogeneous current density distribution by an inhomogeneous distribution of the area density of the contact areas.

Further advantages, preferred examples and developments of the luminescence diode chip will become apparent from the examples explained below in conjunction with the figures.

In the examples and figures, identical or identically acting constituent parts are in each case provided with the same reference symbols. The constituent parts illustrated and the size relationships of the constituent parts among one another should not be considered to be true to scale. However, some details of the figures are illustrated with an exaggerated size to afford a better understanding.

Figure 1:
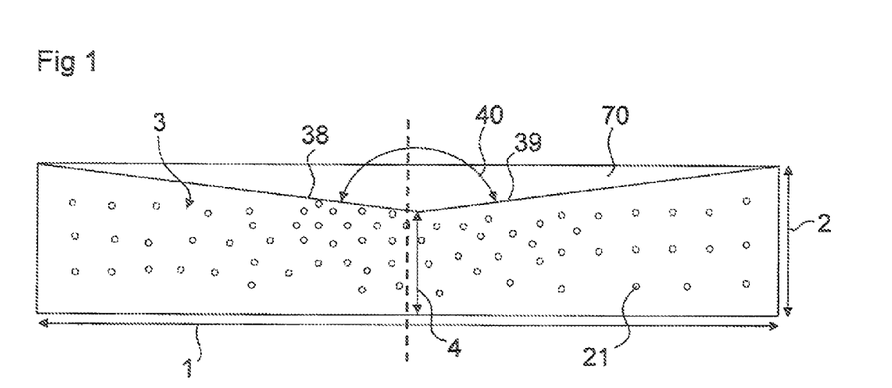
FIG. 1 shows a schematic plan view of the main coupling-out area of the luminescence diode chip of a first example.

FIG. 1 schematically illustrates a luminescence diode chip in a plan view of a main coupling-out area 3. The chip has an elongated and asymmetrical form in plan view. The form of the luminescence diode chip is, for example, such that it is obtained proceeding from a rectangle by the latter being provided with a cutout 70 at a longitudinal side. The cutout 70 has, for example, the form of a triangle or a form in the manner of a triangle. "In the manner of a triangle" means that the form of the cutout need not necessarily correspond to the exact mathematic definition of a triangle. Rather, slight deviations from this form are possible. Examples of such possible slight deviations are rounded edges or side lines not running exactly straight.

In the example illustrated in FIG. 1, the triangle is not an isosceles triangle. In an alternative example, however, it could, in principle, also be an isosceles triangle. In such a case, the form of luminescence diode chip in plan view or the form of the main coupling-out area 3 could also have a mirror symmetry.

In the example illustrated in FIG. 2, the main coupling-out area 3 of the luminescence diode chip illustrated in plan view has the same form as in the example explained with reference to FIG. 1. In contrast to the example illustrated in FIG. 1, however, the luminescence diode chip illustrated in FIG. 2 has no cutout 70. Instead, in plan view at the location at which there is the cutout 70 in the first example, a bonding pad 26 is formed. Consequently, the luminescence diode chip has a different form than the main coupling-out area 3 overall in plan view. By way of example, the luminescence diode chip has a rectangular form or a form in the manner of a rectangle.

The bonding pad 26 is arranged on a main side of the luminescence diode chip facing in the main emission direction. It functions as a diaphragm. The bonding pad shields at least a large part of the radiation which is generated in the active layer of the luminescence diode chip and which impinges on the bonding pad 26. Preferably it shields more than 70%, more than 80% or more than 90% of the radiation which impinges on it. The bonding pad 26 can be, in particular, substantially completely opaque to the electromagnetic radiation generated in the active layer.

Relative to the example illustrated in FIG. 1, the luminescence diode chip, instead of having a cutout 70, could, for example, also have a part of a semiconductor layer sequence, which part is shaped in accordance with the cutout 70 illustrated and either has no active layer or its active layer is electrically isolated from the remaining part of the luminescence diode chip. In such a case, too, the effective main coupling-out area 3 would have a different form than the luminescence diode chip in plan view overall. An area which faces in the main emission direction and via which radiation is coupled out slightly, but which does not laterally overlap a part of the active layer, should not be considered to be part of the main coupling-out area.

Figure 2:
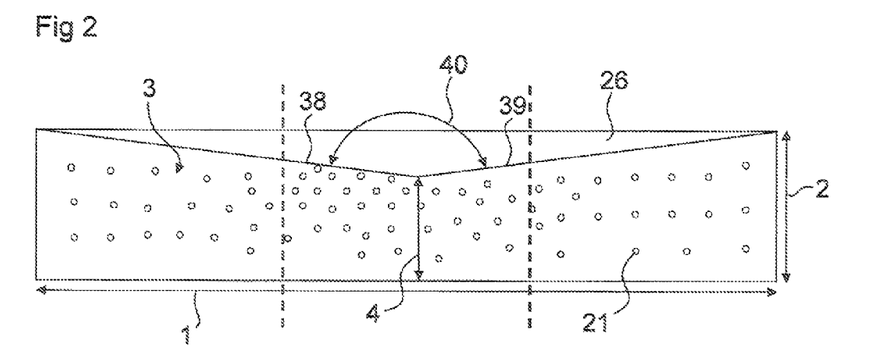
FIG. 2 shows a schematic plan view of the main coupling-out area of the luminescence diode chip of a second example.

The position of a plurality of contact areas 21 of a first electrical connection layer of the luminescence diode chip is in each case depicted in FIGS. 1 and 2. The contact areas 21 can be arranged on a front side of a semiconductor layer sequence of the luminescence diode chip, the front side facing in the main emission direction. Alternatively, they can also be arranged on a rear side of the semiconductor layer sequence of the luminescence diode chip, the rear side facing away from the main emission direction. In a further alternative, the contact areas 21 are arranged in the semiconductor layer sequence of the luminescence diode chip, that is to say that they are situated in a vertical direction between the front side and the rear side of the semiconductor layer sequence. Different examples of this type are explained in greater detail in connection with FIGS. 6, 7 and 8.

The luminescence diode chips illustrated with reference to FIGS. 1 and 2 both have, for example, 72 contact areas 21 of the first electrical contact layer. There could also be more contact areas, for example, at least 75, at least 80 or at least 90 contact areas 21. Alternatively, there could also be fewer contacts, for example, between 50 and 70 contact areas inclusive.

The contact areas all have the same size, for example. Alternatively, the chips can also have contact areas 21 of the first electrical contact layer which have different sizes. In particular, the area density of the contact areas 21 along the main plane of extent of the semiconductor layer sequence can at least partly be set by contact areas having different sizes. Additionally or alternatively, the area density is set by varying the number of contact areas along the main plane of extent of the semiconductor layer sequence.

In the examples, the contact areas 21 are all spaced apart from one another. As already explained in the general part of the description, however, this is not absolutely necessary. Thus, by way of example, larger contact areas can be interconnected by comparatively small-area contact area connecting pieces. In this case, each larger compact contact area part should be regarded as a contact area 21. In this case, it is also possible to refer to contact area islands which are connected to one another at least in part by contact area connecting pieces.

In FIG. 1, a dashed line is used to depict a limiting straight line that divides the main coupling-out area 3 into two halves. The limiting straight line runs perpendicular to a length section 1 of the main coupling-out area 3 and intersects the latter perpendicularly in the center. The length section 1 extends over the entire extent of the main coupling-out area 3 or of the luminescence diode chip in the direction of the main straight line of extent thereof.

In the case of the two halves divided in this way, the left half in plan view in FIG. 1 has, for example, 39 contact areas having an identical size. The right half has, for example, 32 contact areas having an identical size. The limiting straight line runs through a contact area 21 which is ascribed to neither one nor the other half. Consequently, the number of contact areas in the left half is more than 20% greater than that in the right half. If the contact areas all have the same size, then the summed area of the contact areas 21 in the left half is likewise more than 20% greater than in the right half. An inhomogeneous distribution of the area density of the contact areas along a main plane of extent of the semiconductor layer sequence is already set just as a result of this.

Two dashed lines are plotted in FIG. 2, which represent limiting straight lines that divide the main coupling-out area 3 into three thirds. The limiting straight lines intersect the length section 1 perpendicularly in each case. One limiting straight line intersects the length section 1 at one third of the length thereof and the other intersects the length section 1 at two thirds of the length thereof.

The central third contains 33 contact areas 21. The left outer third contains 19 contact areas 21 and the right outer third contains 20 contact areas 21. Consequently, more than 60% more contact areas 21 are arranged in the central third than respectively in the outer two thirds. If, moreover, the contact areas all have the same size, then the summed size of the contact areas 21 in the central third is therefore also correspondingly greater than the respective summed contact area of the two outer thirds.

It goes without saying that the contact areas 21 are not or not necessarily arranged on the main coupling-out area 3. Rather, the subdivision and the respective number and summed size of the contact areas 21 relate to the contact areas 21 which, in a plan view of the main coupling-out area 3, are situated in the respective region of the main coupling-out area 3, in particular below the main coupling-out area 3. The contact areas 21 are therefore situated in the region of one or the other half (FIG. 1) or in the region of one of the thirds of the main coupling-out area 3 (FIG. 2).

If, in FIG. 2, the central third of the main coupling-out area is halved, then 20 contact areas 21 are situated in the region of one of these two halves and 12 contact areas 21 are situated in the region of the other half. Consequently, more than 60% more contact areas 21 are arranged in one of the halves of the central third than in the other half of the central third of the main coupling-out area 3.

The main coupling-out area 3 has in plan view a location at which its width has a minimum 4. Sections having a width that becomes increasingly larger follow the location having the minimum width 4 in both directions along the length l of the main coupling-out area.

At the ends or at edges lying opposite one another, the main coupling-out area 3, has, e.g., a maximum width 2. This is the width of the main coupling-out area 3, that is to say the maximum extent perpendicular to a main straight line of extent of the main coupling-out area 3.

The edge of the main coupling-out area 3 has two sections 38, 39, which form an angle 40 of approximately 165°, for example, at the outer side of the main coupling-out area 3. To put it another way, the two sections 38, 39 are tilted by approximately 15° with respect to one another.

A luminescence diode chip having a main coupling-out area 3 shaped in this way is particularly suitable as luminous means for a headlight of a motor vehicle. For a low-beam light of such a headlight, the standard provides, inter alia, a sharp bright-dark boundary in the upper region of an emitted headlight cone. The bright-dark boundary is intended to run approximately horizontally with respect to a road in a first section and to run upward at approximately 15° relative to the horizontal toward the roadside in a second section.

The two sections 38, 39 of the edge of the main coupling-out area 3 are embodied as straight in each case, for example. However, this is not absolutely necessary. By way of example, at least one of the sections can be embodied, at least sectionally, as slightly curved or with any other profile that deviates from a straight line. In such a case, the angle 40 formed by the two sections 38, 39 is measured between the main straight lines of extent of the sections 38, 39.

It is preferred for the transition between the sections 38, 39 to have a sharp bend. However, this is likewise not absolutely necessary and not necessary in all cases. By way of example, the bend can be rounded or there can be a differently shaped section of the edge as transition between the sections 38, 39. It is also possible, in particular, for the width of the main coupling-out area 3 to be minimal in this transition section or in a part of this transition section or to have at least one local minimum.

Figure 3:
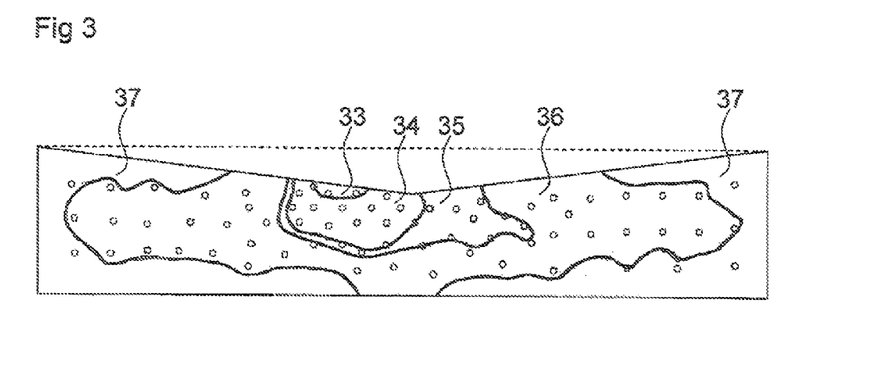
FIG. 3 shows a schematic plan view of the main coupling-out area of the luminescence diode chip of the first example with plotted regions of emitted radiation intensity having different magnitudes.

In FIG. 3, a plurality of regions having an irradiance or illuminance having different magnitudes are depicted in the main coupling-out area. The depicted boundaries of the regions run approximately along lines with the same illuminance or irradiance. The main coupling-out area and the contact areas are embodied as in the examples illustrated with reference to FIGS. 1 and 2.

A first region 33 of the main coupling-out area has a highest irradiance or illuminance. The further away from the first region 33 the remaining regions 34, 35, 36, 37 are, the lower their irradiance or illuminance. The irradiance of the first region 33 is, for example, at least six times or at least eight times as high as that of the outermost region 37.

In FIG. 3 it can clearly be discerned that the main coupling-out area of the luminescence diode chip emits a very inhomogeneous radiance or luminance distribution. This inhomogeneous radiance or luminance distribution is realized in a targeted manner by an inhomogeneous distribution of the area density of the contact areas and the associated inhomogeneous current density distribution in the semiconductor layer sequence.

With a luminescence diode chip of this type, a headlight for a low-beam light of a motor vehicle can be realized in a technically simple way. In particular, a radiance or luminance distribution prescribed for such headlights can be realized, in principle, by a simple imaging of the main coupling-out area 3 with an imaging optical unit 50. In this respect, see FIG. 4, which schematically illustrates a luminescence diode chip 101 and an imaging optical unit 50 in a side view.

Complex specific optical units by which, for example, a largely homogeneous headlight cone is "shaped" such that it is emitted from the optical unit with a very much more inhomogeneous radiance or luminance distribution can advantageously be dispensed with, in principle. Of course, it is nevertheless possible to use optical units which influence the radiance distribution. However, possible optical units of this type can be developed and produced significantly more simply since at least a coarse radiance distribution can already be realized by the design of the luminescence diode chip.

In principle, the luminescence diode chips illustrated in FIGS. 1 to 3 can also be embodied as "mirror-inverted," in the sense that the forms and structures illustrated in the figures are mirrored at one of the two transverse edges (that is to say the edges of the chip which run along the width of the main coupling-out area in plan view).

Figure 4:
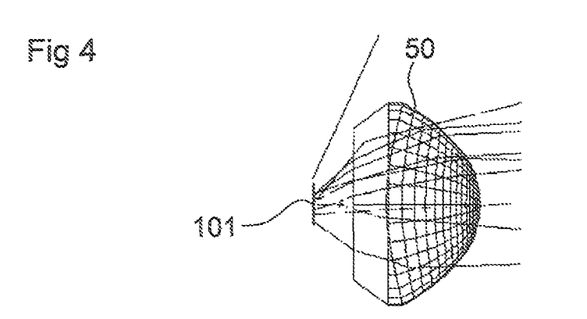
FIG. 4 shows a schematic side view of an arrangement of the luminescence diode chip with an imaging optical unit.
Figure 5:
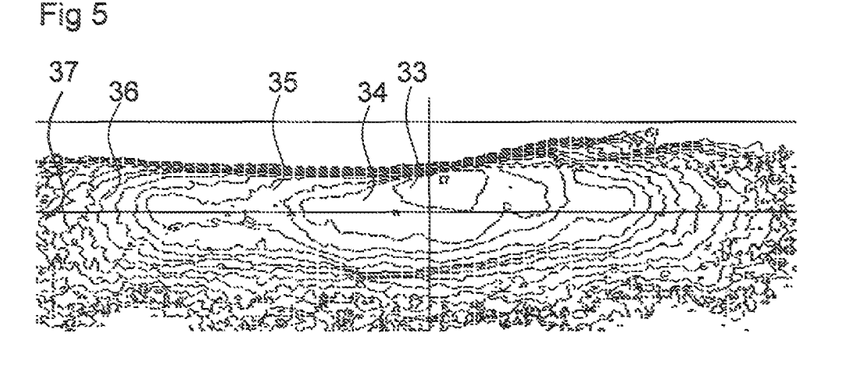
FIG. 5 shows an illustration of an exemplary radiation intensity distribution of a radiation cone emitted by the imaging optical unit in FIG. 4, in cross section.

FIG. 5 illustrates a resulting irradiance or illuminance of a radiation cone emitted by the imaging optical unit 50 in FIG. 4 onto a plane running perpendicularly to the main emission direction. It can be discerned that a sharp bright-dark boundary is realized at the top side. The bright-dark boundary additionally has a section which is tilted by approximately 15° with respect to another section or with respect to a horizontal.

FIG. 5 indicates regions which approximately correspond to the regions depicted in FIG. 3. A first region 33 has a highest irradiance or illuminance. The further away from the first region 33 the regions are, the lower the irradiance or illuminance measured in them.

Figure 6:
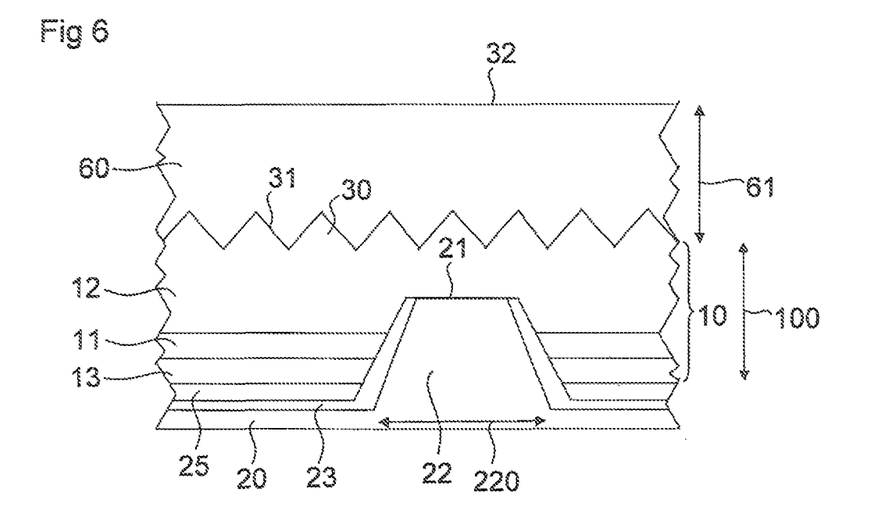
FIG. 6 shows a schematic sectional view of a part of the luminescence diode chip of a third example.

The excerpt from an exemplary luminescence diode chip illustrated in FIG. 6 in a schematic lateral sectional view contains a semiconductor layer sequence 10. The semiconductor layer sequence 10 comprises an active layer 11, a semiconductor layer 13 doped in p-conducting fashion, and a semiconductor layer 12 doped in n-conducting fashion. Each of these layers 11, 12, 13 of the semiconductor layer sequence 10 can be composed, in particular, of a plurality of partial layers, which, in particular, can also have different material compositions.

The semiconductor layer sequence comprises III/V compound semiconductor materials, for example. A III/V compound semiconductor material comprises at least one element from the third main group, such as, for example, B, Al, Ga, In, and an element from the fifth main group, such as, for example, N, P, As. In particular, the term "III/V compound semiconductor material" encompasses the group of the binary, ternary or quaternary compounds containing at least one element from the third main group and at least one element from the fifth main group, for example, nitride and phosphide compound semiconductors. Moreover, such a binary, ternary or quaternary compound can comprise, for example, one or more dopants and additional constituents.

The active layer 11 preferably comprises a pn junction, a double heterostructure, a single quantum well (SQW) or, particularly preferably, a multiquantum well (MQW) structure for generating radiation. In this case, the designation quantum well structure does not exhibit any significance with regard to the dimensionality of the quantization. It therefore encompasses, inter alia, quantum wells, quantum wires and quantum dots and any combination of these structures. Examples of MQW structures are known to those skilled in the art.

The luminescence diode chip is a thin-film light-emitting diode chip, for example. In particular, it has a carrier substrate at its rear side. In one configuration, the first and second electrical connection layers are arranged at least in places between the semiconductor layer sequence and the carrier substrate.

A thin-film light-emitting diode chip is distinguished by at least one of the following characteristic features:
  a reflective layer is applied or formed at a main area—facing toward a carrier element, in particular the carrier substrate—of the semiconductor layer sequence, which is an epitaxial layer sequence, in particular, the reflective layer reflecting at least part of the electromagnetic radiation generated in the semiconductor layer sequence back into the latter;
  the thin-film light-emitting diode chip has a carrier element, which is not the growth substrate on which the semiconductor layer sequence was growing epitaxially, but rather a separate carrier element subsequently fixed to the semiconductor layer sequence;
  the semiconductor layer sequence has a thickness in the range of 20 µm or less, in particular in the range of 10 µm or less;
  the semiconductor layer sequence is free of a growth substrate. In the present case "free of a growth substrate" means that a growth substrate possibly used for growth purposes is removed from the semiconductor layer sequence or at least greatly thinned. In particular, it is thinned in such a way that it is not self-supporting by itself or together with the epitaxial layer sequence alone. The remaining residue of the greatly thinned growth substrate is, in particular, unsuitable as such for the function of a growth substrate; and
  the semiconductor layer sequence contains at least one semiconductor layer having at least one area which has an intermixing structure which ideally leads to an approximately ergodic distribution of the light in the semiconductor layer sequence, that is to say that it has an as far as possible ergodically stochastic scattering behavior.

A thin-film light-emitting diode chip is, to a good approximation, a Lambertian surface emitter and is therefore well suited, for example, to the application in a headlight, for instance a motor vehicle headlight.

In the example illustrated in FIG. 6, the semiconductor layer sequence 10 has a main coupling-out area 31 on a front side facing in the main emission direction. A first electrical contact layer 20 and a second electrical contact layer 25 are arranged on a rear side of the semiconductor layer sequence lying opposite the front side. The first electrical contact layer 20 and the second electrical contact layer 25 are electrically insulated from one another, for example, by an electrically insulating layer 23.

The first electrical connection layer 20 and the second electrical connection layer 25 laterally overlap one another. In the example illustrated in FIG. 6, the electrically insulating layer 23 also laterally overlaps the electrical connection layers 20, 25. Laterally means in a direction parallel to a main plane of extent of the semiconductor layer sequence.

On its rear side, the semiconductor layer sequence 10 has a perforation extending through the active layer 11. The perforation is in the form of a cutout, for example. A partial region 22 of the first electrical connection layer 20 extends from the rear side through the perforation of the active layer in a direction toward the main coupling-out area. In the perforation, the partial region 22 touches the semiconductor layer 12 doped in n-conducting fashion with at least one connection area 21.

By way of example, all the connection areas 21 of the luminescence diode chip are produced in the same way. That is to say that each of the connection areas 21 of the first electrical connection layer 20 is formed by a partial region 22 which extends from the rear side of the semiconductor layer sequence through a perforation of the active layer in a direction toward the main coupling-out area and touches a layer of the semiconductor layer sequence 10. The partial region 22 is electrically insulated from the active layer 11 and the semiconductor layer 13 doped in p-conducting fashion, for example, by the electrically insulating layer 23.

The perforation is in the form of a depression having, for example, the form of a circular cylinder or an elliptical cylinder, a parallelepiped, a cone, or truncated cone, a pyramid or a truncated pyramid. Alternatively, the depression can also be a trench having an elongated form. Preferably, the trench has a substantially planar bottom area. In one configuration, the cross section of the trench increases in size from the bottom area toward its opening. The cutout is produced by etching, for example.

The cross section of the cutout tapers from the opening in the direction of the bottom. Correspondingly, the partial region 22 of the first electrical connection layer 20 also tapers in the course from the rear side of the semiconductor layer sequence toward the connection area 21. In the region of the rear side, the partial region 22 has, for example, a lateral extent 220 from a range of between 1 µm and 40 µm inclusive. By way of example, the lateral extent 220 is 5 µm, 10 µm, 15 µm, 25 µm or 35 µm. The corresponding lateral extent of the connection area 21 is, for example, between 10% and 50% inclusive smaller than the lateral extent of the partial region in the region of the rear side of the semiconductor layer sequence.

The main coupling-out area 31 of the semiconductor layer sequence 10 has a structuring with structure units 30. The structure units 30 have, for example, a first lateral extent, a second lateral extent, measured perpendicularly to the first lateral extent, and a vertical extent, which in each case lie in a range of between 0.1 µm and 2.5 µm inclusive. The structure units can have different sizes and be shaped differently. They are suitable for influencing the coupling-out of electromagnetic radiation from the semiconductor layer sequence 10.

A luminescence conversion layer 60 is applied on the main coupling-out area 31 of the semiconductor layer sequence 10. The luminescence conversion layer comprises at least one phosphor which is suitable for converting the electromagnetic radiation generated in the active layer 11 at least partly into an electromagnetic radiation in an altered wavelength range. An outer area of the luminescence conversion layer 60 facing away from the semiconductor layer sequence 10 forms, for example, the main coupling-out area 32 of the luminescence diode chip.

The main coupling-out area 31 of the semiconductor layer sequence 10 and the main coupling-out area 32 of the luminescence diode chip have an identical form, for example, in plan view. It is possible for the entire main coupling-out area 32 of the luminescence diode chip to be formed by an outer area of a material applied to the semiconductor layer sequence 10, for example, of a luminescence conversion layer 60. Alternatively, however, it is also possible for only one part of the main coupling-out area to be formed by such a material and a further part to be formed, for example, by uncovered regions of the main coupling-out area 31 of the semiconductor layer sequence 10.

All phosphors known for application in the case of LEDs are suitable for the luminescence conversion layer 60. Examples of such phosphors and phosphor mixtures are:
 chlorosilicates,
 orthosilicates, sulfides, thiometals and vanadates,
 aluminates, oxides, halophosphates,
 nitrides, sions, sialons, and
 garnets of the rare earths, such as cerium-doped yttrium-aluminum garnet, and of the alkaline earth metal elements.

The electromagnetic radiation emitted by the semiconductor layer sequence 10 is scattered by the structure units 30 and the luminescence conversion layer 60. As a result, those regions which lie above the partial regions 22 of the first electrical connection layer 20 do not appear darkened, or appear only slightly as darkened, in comparison with adjoining regions of the main coupling-out area 32.

The semiconductor layer sequence has, for example, a height 100 from a range of between 3 µm and 5 µm inclusive. The luminescence conversion layer 60 has, for example, a thickness 61 from a range of between 15 µm and 30 µm inclusive.

Figure 7:
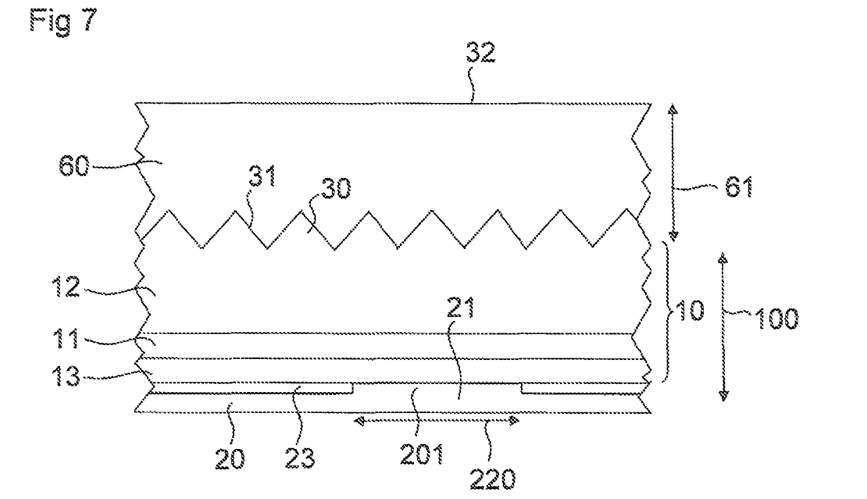
FIG. 7 shows a schematic sectional view of a part of the luminescence diode chip of a fourth example.

In the example illustrated in FIG. 7, the first electrical connection layer 20 has no partial region extending through a perforation through the active layer 11. Instead, the electrical connection areas 21 of the first electrical connection layer 20 are arranged, for example, at the rear side of the semiconductor layer sequence 10. The electrical connection areas 21 touch and make contact with, for example, a semiconductor layer 13 doped in p-conducting fashion of the semiconductor layer sequence 10.

A plurality of electrical connection areas 21 are formed with the aid of an electrically insulating layer 23, for example. The electrically insulating layer 23 has cutouts in the regions in which electrical connection areas 21 are provided. A partial region 201 of the first electrical connection layer in each case extends into the cutout and forms an electrical connection area 21 at the semiconductor layer sequence 10.

One example of an electrically insulating material is silicon dioxide. The electrical connection areas can comprise conventional metals, for example. Additionally or alternatively, the electrical connection areas can also comprise transparent, electrically conductive oxides (transparent conductive oxides, TCO), such as indium tin oxide or zinc oxide.

The opening in the electrically insulating layer 23 has, for example, a lateral extent 220 of between 1 µm and 40 µm inclusive, or between 1 µm and 20 µm inclusive. A corresponding lateral extent of the electrical connection layer 21 is approximately of exactly the same size as the lateral extent 220 of the opening of the electrically insulating layer 23.

In the example illustrated in FIG. 7, a second electrical connection layer can be arranged at the front side of the semiconductor layer sequence 10, but this is not illustrated.

Figure 8:
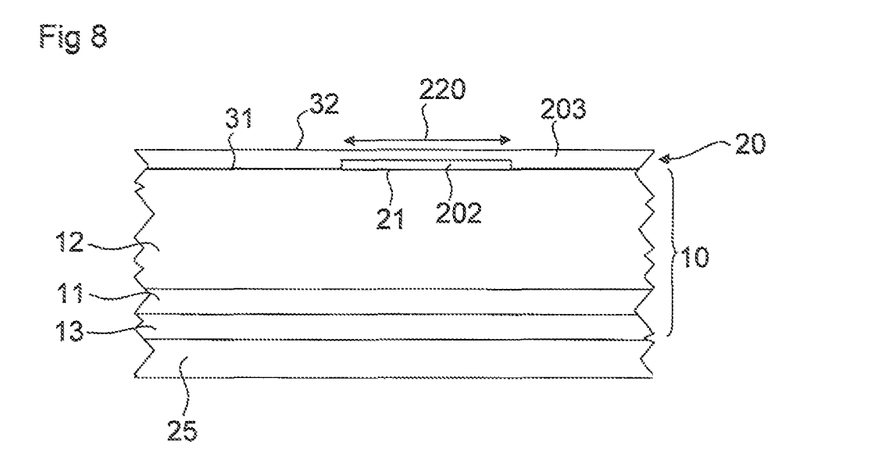
FIG. 8 shows a schematic sectional view of a part of the luminescence diode chip of a fifth example.

In the example illustrated in FIG. 8, the first electrical connection layer 20 is arranged at the front side of the semiconductor layer sequence 10 of the luminescence diode chip. The first electrical contact layer 20 has a first partial layer 203, which is transmissive to the electromagnetic radiation emitted by the active layer 11. The first partial layer 203 forms no or only a comparatively poorly conducting electrical contact, for example, with the adjoining semiconductor layer 12 doped in n-conducting fashion. It comprises, for example, a TCO such as indium tin oxide or zinc oxide.

A highly conductive electrical contact between the first electrical connection layer 20 and the semiconductor layer sequence 10 is formed by a second partial layer 202 of the first electrical connection layer 20. The second partial layer 202 is arranged, for example, between the first partial layer 203 and the semiconductor layer sequence 10. Where the second partial layer 202 touches the semiconductor layer sequence 10, an electrical contact area 1 is formed. The second partial layer 202 touches the semiconductor layer 122 doped in n-conducting fashion, for example.

The luminescence diode chip preferably has a multiplicity of such second partial layers 202. The second partial layer 202 is formed by a very thin metal layer, for example. The latter can have a thickness of, for example, just a few nanometers, e.g., 2 nm, 4 nm or 5 nm. Alternatively, it is also possible for the electrical contact areas 21 to be formed without the aid of such second partial layers 202 of the first electrical connection layer 20. This can be effected, for example, by a corresponding preparation of the surface of the semiconductor layer sequence 10 with which contact is to be made. By way of example, in the regions in which formation of an electrical contact area 21 is undesired, the semiconductor surface can be roughened such that only a very poorly conductive or nonconductive electrical contact forms between the first partial layer 203 of the radiation-transmissive first electrical connection layer 20 and the semiconductor material. In the regions in which an electrical contact area is desired, the semiconductor surface is comparatively smooth, such that a highly electrically conductive contact forms between the first partial layer 203 of the radiation-transmissive first electrical connection layer 20 and the semiconductor material.

In the example illustrated in FIG. 8, the first electrical connection layer 20, in accordance with one configuration, can have a bonding pad 26, which serves as a radiation diaphragm. One example of the luminescence diode chip comprising such a bonding pad 26 has been described above in connection with FIG. 2. The bonding pad 26 is electrically conductively connected, for example, to the first radiation-transmissive partial layer 203 of the first electrical connection layer 20.

In the example illustrated in FIG. 8, a second electrical connection layer 25 is arranged at the rear side of the semiconductor layer sequence 10.

FIGS. 9 to 13 illustrate five different examples of luminescence diode chips having a differently shaped main coupling-out area 3. The luminescence diode chips illustrated in FIGS. 9 to 12 each have a main coupling-out area 3 having an elongated form that deviates from a rectangular form by virtue of at least one cutout 70. The cutout 70 has, for example, the form of a triangle or a form in the manner of a triangle. For the sake of simplicity, however, only the expression "triangular cutout" is used hereinafter.

Figure 9:
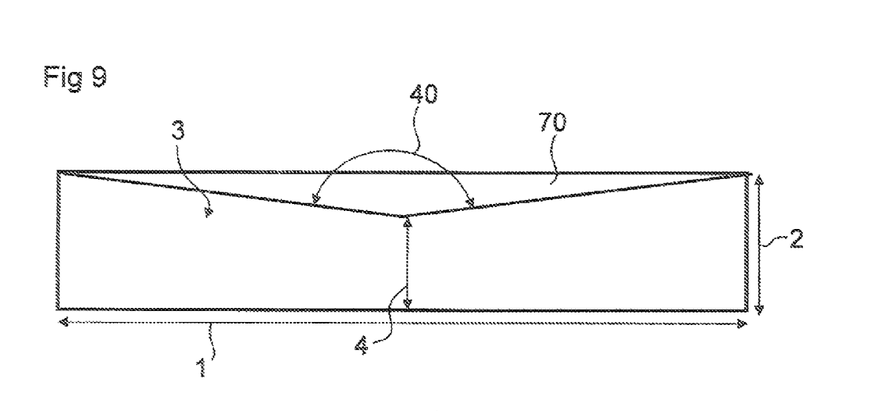
FIG. 9 shows a schematic plan view of the main coupling-out area of the luminescence diode chip of a sixth example.
Figure 10:
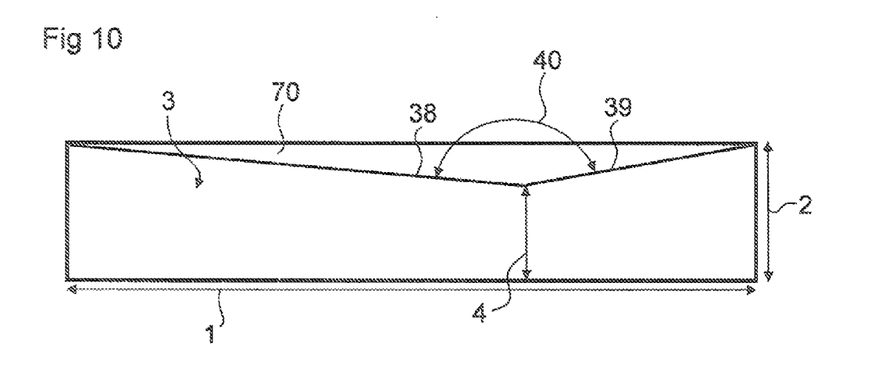
FIG. 10 shows a schematic plan view of the main coupling-out area of the luminescence diode chip of a seventh example.

In the examples illustrated in FIGS. 9 and 10, the cutout 70 extends, for example, over the entire length l of the luminescence diode chip. Two legs of the triangular cutout 70 respectively form edge parts of the main coupling-out area 3.

In the example illustrated in FIG. 9, the legs are virtually identical in size. They deviate from one another by less than 20%, for example. In the examples illustrated in FIGS. 10 to 12, the legs have lengths having greatly different magnitudes. By way of example, one of the legs is between two and five, inclusive, times as large as the other of the legs of the triangular cutout 70.

In the example illustrated in FIG. 10, one leg of the cutout 70 is, for example, twice as large as the other leg. In the examples illustrated in FIGS. 11 and 12, one leg of the triangular cutout 70 is, for example, four times as large as the other leg.

Figure 11:
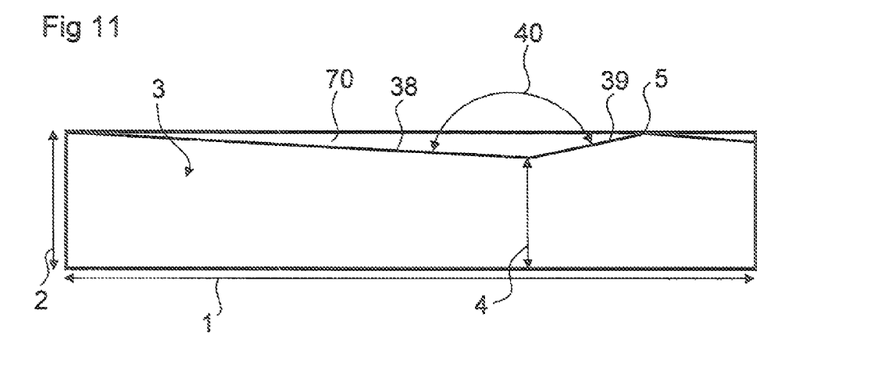
FIG. 11 shows a schematic plan view of the main coupling-out area of the luminescence diode chip of an eighth example.
Figure 12:
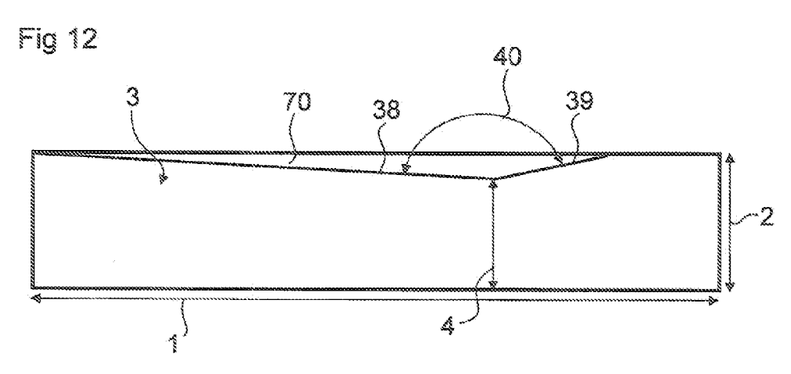
FIG. 12 shows a schematic plan view of the main coupling-out area of the luminescence diode chip of a ninth example.

The example of the luminescence diode chip as illustrated in FIG. 11 has in plan view a main coupling-out area which deviates from a rectangular form not only by virtue of a triangular cutout 70 but also by virtue of a second, significantly smaller cutout. Both cutouts are introduced on the same main side of the main coupling-out area. By way of example, they adjoin one another. Between the cutouts, the main coupling-out area 3 has a point 5 or a region in which the main coupling-out area has a maximum width 2. Proceeding from this point or region where the width has a maximum, the width of the main coupling-out area 3 increasingly decreases in both directions along the length section 1.

Figure 13:
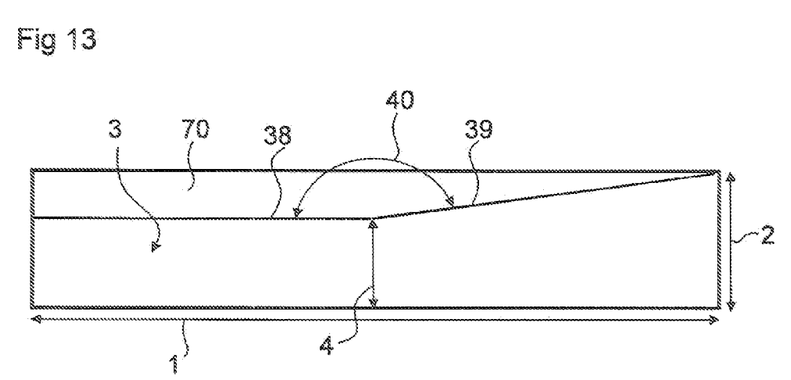
FIG. 13 shows a schematic plan view of the main coupling-out area of the luminescence diode chip of a tenth example.

In the example in accordance with FIG. 13, the form of the main coupling-out area 3 in plan view deviates from the form of a rectangle not by virtue of a triangular cutout but rather by virtue of a quadrangular cutout 70. The width of the elongated main coupling-out area 3 is minimal on one side and remains constant in the course toward the other side. In a region corresponding, e.g., to between 40% and 60% inclusive of the length l of the main coupling-out area 3, the form has a bend starting from which the width increases in the further course.

The quadrangular cutout 70 by virtue of which the form of the main coupling-out area 3 of the example illustrated in FIG. 13 deviates from the form of a rectangle is significantly larger than the triangular cutouts 70 in the examples illustrated in FIGS. 9 to 12. That means that in general significantly more active layer of a semiconductor layer sequence wafer can be utilized in the production of the luminescence diode chips illustrated in FIGS. 9 to 12 than in the example in accordance with FIG. 13.

Alternatively, the luminescence diode chip in the examples in accordance with FIGS. 9 to 13 can have in the region of the cutout 70, rather than a cutout, a part of the semiconductor layer sequence covered by a bonding pad. In this case, the bonding pad acts as a diaphragm. It delimits the main coupling-out area 3 on a main side.

This disclosure is not restricted to the examples by the description on the basis of those examples. Rather, the disclosure encompasses any novel feature and also any combination of features, which in particular includes any combination of features in the appended claims, even if the feature or combination itself is not explicitly specified in the claims or examples.

The invention claimed is:

1. A luminescence diode chip comprising:
a semiconductor layer sequence having an active layer that generates electromagnetic radiation, and
a first electrical connection layer which touches and makes electrically conductive contact with the semiconductor layer sequence with a plurality of contact areas,
wherein 1) an inhomogeneous current density distribution is set in the semiconductor layer sequence in a targeted manner by an inhomogeneous distribution of an area density of the contact areas along a main plane of extent of the semiconductor layer sequence such that a first region of a main coupling-out area of the semiconductor layer sequence or of the luminescence diode chip has an irradiance or illuminance at least three times as high as that of at least one second region of the main coupling-out area of the semiconductor layer sequence or of the luminescence diode chip; and 2) a radiation cone emitted by the luminescence diode chip has a radiance distribution corresponding to a radiance distribution for a low-beam light of a motor vehicle.

2. A luminescence diode chip comprising:
a semiconductor layer sequence having an active layer that generates electromagnetic radiation, and
a first electrical connection layer which touches and makes electrically conductive contact with the semiconductor layer sequence with a plurality of contact areas,
wherein 1) an inhomogeneous current density distribution is set in the semiconductor layer sequence in a targeted manner by an inhomogeneous distribution of an area density of the contact areas along a main plane of extent of the semiconductor layer sequence such that a first region of a main coupling-out area of the semiconductor layer sequence or of the luminescence diode chip has an irradiance or illuminance at least three times as high as that of at least one second region of the main coupling-out area of the semiconductor layer sequence or of the luminescence diode chip; and 2) the main coupling-out area of the semiconductor layer sequence has a structuring with structure units which have a first lateral extent, a second lateral extent, measured perpendicularly to the first lateral extent, and/or a vertical extent, which is greater than or equal to 0.2 times a wavelength of the emission maximum of the electromagnetic radiation and less than or equal to 5 times a wavelength of an emission maximum of the electromagnetic radiation.

3. A luminescence diode chip comprising:
a semiconductor layer sequence having an active layer that generates electromagnetic radiation,
a first electrical connection layer which touches and makes electrically conductive contact with the semiconductor layer sequence with a plurality of contact areas, and
a second electrical connection layer arranged on a rear side of the semiconductor layer sequence, which laterally overlaps the first electrical connection layer and is electrically insulated from the first electrical connection layer, and at least one partial region of the first electrical connection layer extends from the rear side through a perforation of the active layer in the direction toward a main coupling-out area of the semiconductor layer sequence or of the luminescence diode chip;
wherein an inhomogeneous current density distribution is set in the semiconductor layer sequence in a targeted manner by an inhomogeneous distribution of an area density of the contact areas along a main plane of extent of the semiconductor layer sequence such that a first region of the main coupling-out area has an irradiance or illuminance at least three times as high as that of at least one second region of the main coupling-out area of the semiconductor layer sequence or of the luminescence diode chip.

4. A luminescence diode chip comprising:
a semiconductor layer sequence having an active layer that generates electromagnetic radiation, and a first electrical connection layer which touches and makes electrically conductive contact with the semiconductor layer sequence with a plurality of contact areas, wherein 1) an inhomogeneous current density distribution is set in the semiconductor layer sequence in a targeted manner by an inhomogeneous distribution of an area density of the contact areas along a main plane of extent of the semiconductor layer sequence such that a first region of a main coupling-out area of the semiconductor layer sequence or of the luminescence diode chip has an irradiance or illuminance at least three times as high as that of at least one second region of the main coupling-out area of the semiconductor layer sequence or of the luminescence diode chip; and 2) at least one of: (i) the main coupling-out area has in plan view two sections of an edge which form an angle of between 155° and 175° inclusive at an outer side of the main coupling-out area; and (ii) the first region of the main coupling-out area adjoins one of two sections of the edge or is spaced apart from one of the two sections by at most 50 μm.

5. A luminescence diode chip comprising:

a semiconductor layer sequence having an active layer that generates electromagnetic radiation, and a first electrical connection layer which touches and makes electrically conductive contact with the semiconductor layer sequence with a plurality of contact areas, wherein 1) an inhomogeneous current density distribution is set in the semiconductor layer sequence in a targeted manner by an inhomogeneous distribution of an area density of the contact areas along a main plane of extent of the semiconductor layer sequence such that a first region of a main coupling-out area of the semiconductor layer sequence or of the luminescence diode chip has an irradiance or illuminance at least three times as high as that of at least one second region of the main coupling-out area of the semiconductor layer sequence or of the luminescence diode chip; and 2) the main coupling-out area has an elongated form in plan view and comprises at least one of: (i) an imaginary subdivision of the main coupling-out area into two halves, with a limiting straight line that intersects a length section of the main coupling-out area perpendicularly in the center, a summed area or number of contact areas in plan view is greater by at least 15% in a region of one of the halves than in a region of the other half; (ii) an imaginary subdivision of the main coupling-out area into three thirds, with limiting straight lines that intersect a length section of the main coupling-out area perpendicularly at one third and at two thirds of the total length, a summed area or a number of contact areas in plan view is greater by at least 30% in a region of a central third than in each case in regions of an outer two thirds; and (iii) a width having an at least local minimum at a location or in a region, and sections having a width that becomes increasingly larger follow a location or a region in both directions along the length of the main coupling-out area.

6. The luminescence diode chip according to claim 5, wherein the irradiance or illuminance of the first region of the main coupling-out area is at least five times as great as that of the second region.

7. The luminescence diode chip according to claim 5, wherein the first contact layer has at least 10 contact areas.

8. The luminescence diode chip according to claim 5, wherein the inhomogeneous current distribution is also an asymmetrical current distribution in the semiconductor layer sequence, which is set in a targeted manner by an asymmetrical distribution of the area density of the contact areas along a main plane of extent of the semiconductor layer sequence.

9. The luminescence diode chip according to claim 5, wherein the main coupling-out area has an asymmetrical form in plan view.

10. The luminescence diode chip according to claim 5, wherein the first electrical connection layer is arranged on a rear side of the semiconductor layer sequence, said rear side being remote from the main coupling-out area.

11. The luminescence diode chip according to claim 5, further comprising a second electrical connection layer and the first and second electrical connection layers are arranged on mutually opposite sides of the semiconductor layer sequence.

* * * * *